(12) United States Patent
Radosavljevic et al.

(10) Patent No.: US 11,329,132 B2
(45) Date of Patent: May 10, 2022

(54) TRANSISTOR WITH POLARIZATION LAYER SUPERLATTICE FOR TARGET THRESHOLD VOLTAGE TUNING

(71) Applicant: Intel Corporation, Santa Clara, CA (US)

(72) Inventors: Marko Radosavljevic, Portland, OR (US); Han Wui Then, Portland, OR (US); Sansaptak Dasgupta, Hillsboro, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 811 days.

(21) Appl. No.: 16/016,406

(22) Filed: Jun. 22, 2018

(65) Prior Publication Data

US 2019/0393311 A1    Dec. 26, 2019

(51) Int. Cl.
*H01L 29/15*      (2006.01)
*H01L 29/423*     (2006.01)
*H01L 29/08*      (2006.01)
*H01L 27/088*     (2006.01)
*H01L 21/02*      (2006.01)
*H01L 21/8252*    (2006.01)
*H01L 21/306*     (2006.01)
*H01L 29/205*     (2006.01)
*H01L 29/778*     (2006.01)
(Continued)

(52) U.S. Cl.
CPC ........ *H01L 29/155* (2013.01); *H01L 21/0254* (2013.01); *H01L 21/02458* (2013.01); *H01L 21/02507* (2013.01); *H01L 21/30621* (2013.01); *H01L 21/8252* (2013.01); *H01L 27/088* (2013.01); *H01L 29/0847* (2013.01); *H01L 29/2003* (2013.01); *H01L 29/205* (2013.01); *H01L 29/4236* (2013.01); *H01L 29/66462* (2013.01); *H01L 29/7783* (2013.01)

(58) Field of Classification Search
CPC ............ H01L 29/155; H01L 21/02458; H01L 21/02507; H01L 21/0254; H01L 21/30621; H01L 21/8252; H01L 27/088; H01L 29/0847; H01L 29/2003; H01L 29/205; H01L 29/4236; H01L 29/66462; H01L 29/7783
See application file for complete search history.

(56) References Cited

U.S. PATENT DOCUMENTS

2016/0300835 A1*  10/2016  Xia ................... H01L 29/66734

FOREIGN PATENT DOCUMENTS

CN         107393956 A    *  11/2017
WO     WO2012046480 A1    *   4/2012

* cited by examiner

*Primary Examiner* — Matthew L Reames
(74) *Attorney, Agent, or Firm* — Schwabe, Williamson & Wyatt, P.C.

(57) ABSTRACT

A semiconductor device is disclosed. The semiconductor device includes a substrate, a superlattice that includes a plurality of layers of alternating materials above the substrate, where each of the plurality of layers corresponds to a threshold voltage, a gate trench extending into the superlattice to a predetermined one of the plurality of layers of the superlattice structure, and a high-k layer on the bottom and sidewall of the trench, the high-k layer contacting an etch stop layer of one of the plurality of layers of alternating materials. A gate is located in the trench on top of the high-k layer.

20 Claims, 5 Drawing Sheets

(51) Int. Cl.
*H01L 29/66* (2006.01)
*H01L 29/20* (2006.01)

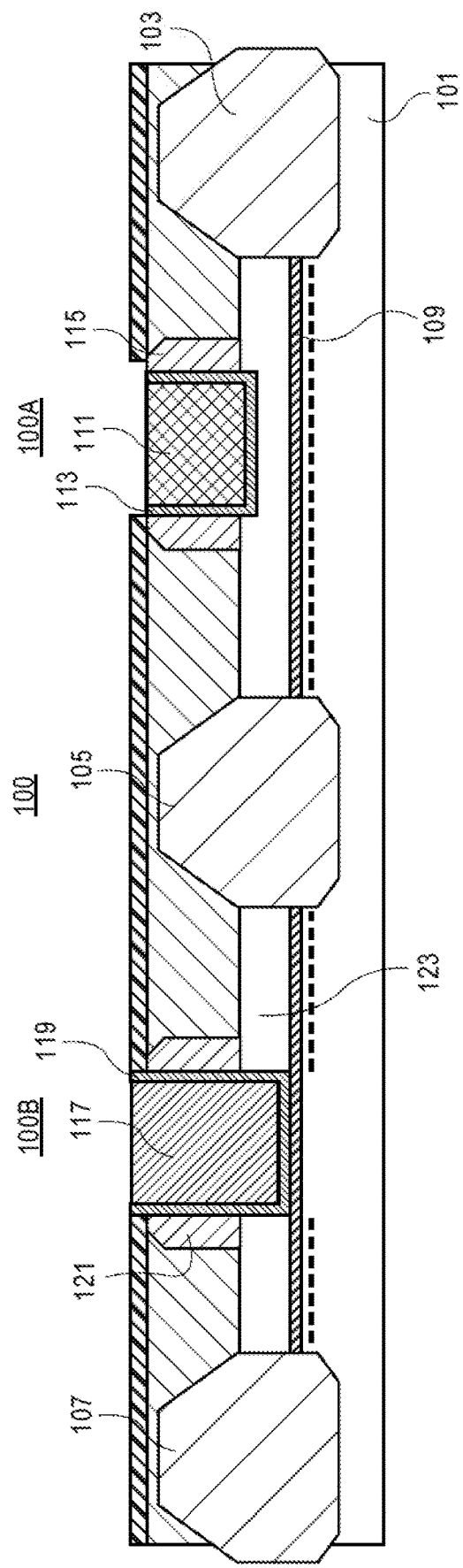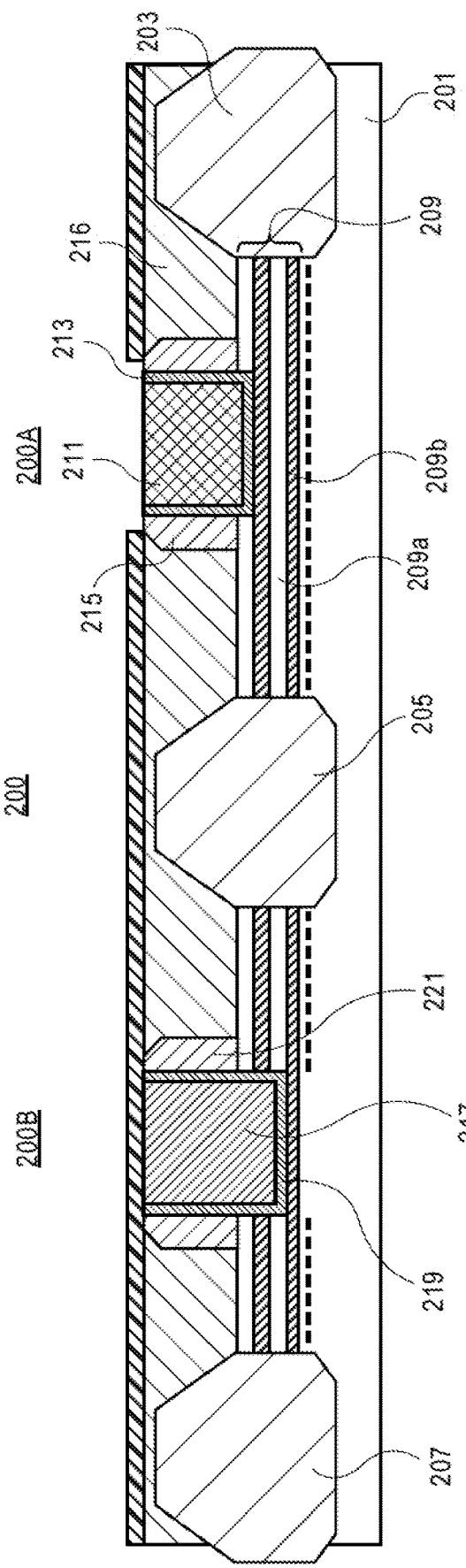

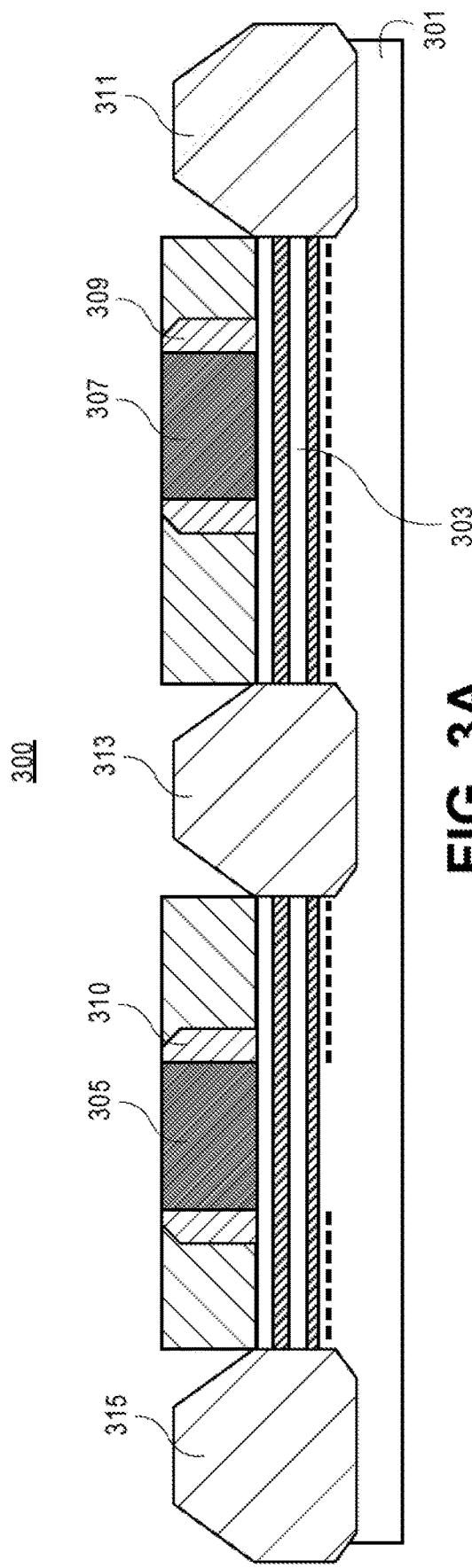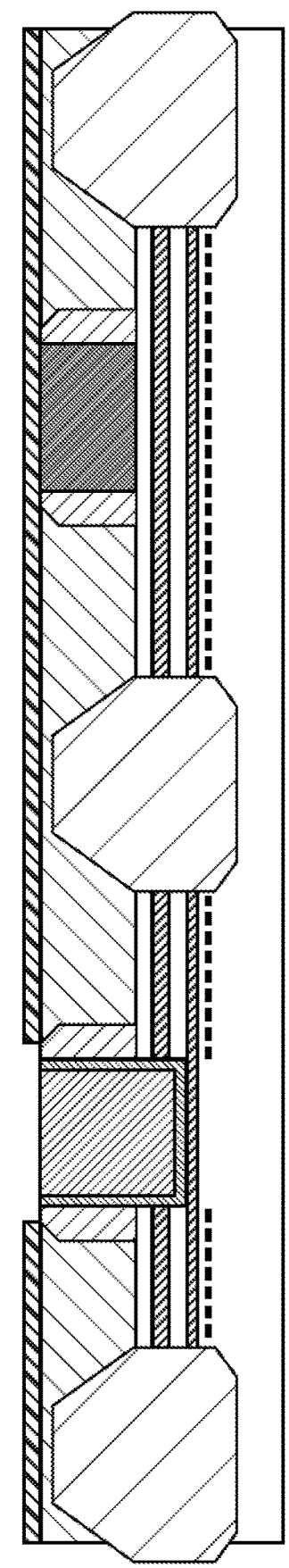
FIG. 3A
FIG. 3B

TRANSISTOR WITH POLARIZATION LAYER SUPERLATTICE FOR TARGET THRESHOLD VOLTAGE TUNING

TECHNICAL FIELD

Embodiments of the disclosure pertain to transistor target threshold voltage tuning and, in particular, transistors with a polarization layer superlattice for transistor target threshold voltage tuning.

BACKGROUND

Monolithically integrated transistors that have different threshold voltage requirements are being developed for future radio frequency (RF) products such as the forthcoming fifth generation (5G) RF products. Gallium nitride transistors are potential candidates for use in such products. In order to enable the use of gallium nitride transistors in that product space, monolithically integrated gallium nitride transistors that operate using multiple, carefully targeted threshold voltages are needed. Such gallium nitride transistors can include monolithically integrated enhancement mode and depletion mode transistors that are formed on the same wafer.

CMOS (Complementary Metal-Oxide Semiconductor) is a low-cost, high-volume digital process technology. CMOS-based devices use minimal power and don't produce as much heat as some other technologies. CMOS enables more functions, such as the RF and baseband components, to be integrated into a single chip.

In some CMOS approaches, the threshold voltage for transistors is attempted to be set through work function engineering. However, such "targeting" of threshold voltage using work function engineering alone is insufficient for gallium nitride transistors. Such transistors have large channel charge densities at zero bias. Because of the large channel charge density at zero bias, work function engineering alone cannot sufficiently shift threshold voltage. In another approach, the threshold voltage for transistors is attempted to be set through polarization layer thickness tuning.

The main disadvantage of polarization layer thickness tuning is process control. In particular, with regard to polarization layer thickness and etch rate which can be non-uniform across a wafer. As such, using the same etching methodology to etch the polarization layer at different places on the wafer can provide distinctly different results. For example, threshold voltage can change by as much as 0.5 volts for every 1 nm polarization layer thickness change. Consequently, manufacturing presents challenges as slight changes in threshold voltage can severely impact product performance.

BRIEF DESCRIPTION OF THE DRAWINGS

FIG. 1 is an illustration of a semiconductor structure that includes first and second transistors that have different threshold voltages.

FIG. 2 is an illustration of a semiconductor structure that includes first and second transistors with different threshold voltages according to an embodiment.

FIGS. 3A-3C are illustrations of cross-sections of a semiconductor structure under fabrication that includes a polarization layer superlattice according to an embodiment.

DESCRIPTION OF THE EMBODIMENTS

Figure 3C:
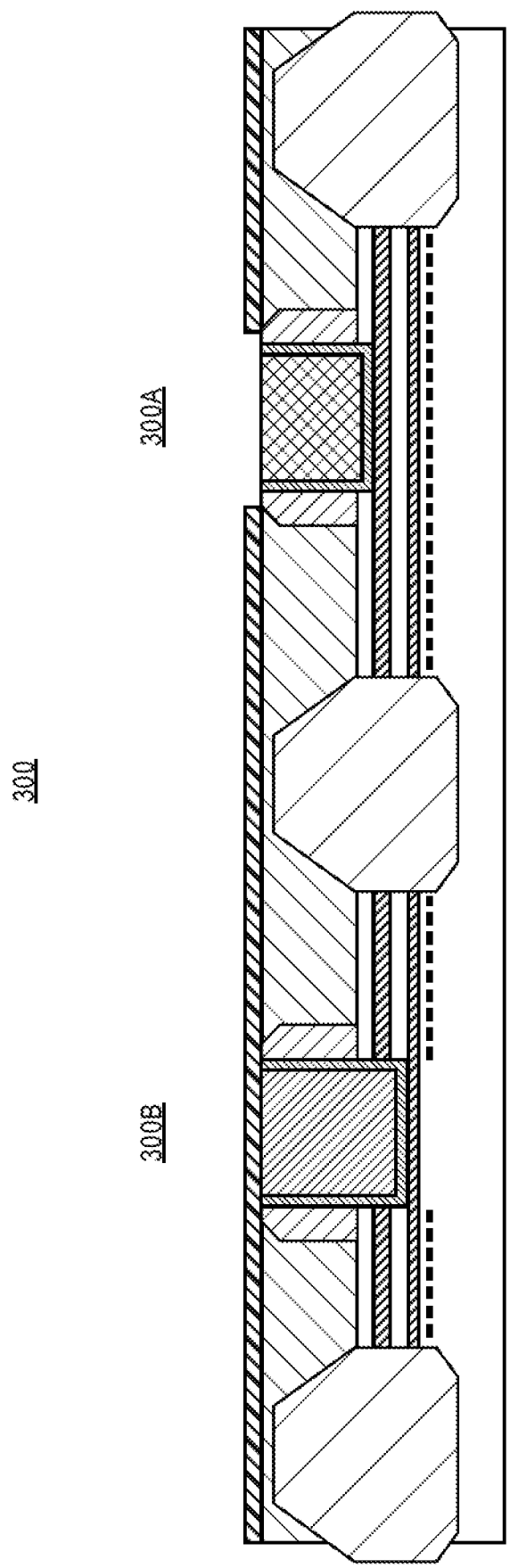

Transistors with polarization layer superlattice for realizing target threshold voltages, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Previous approaches to setting or "tuning" the threshold voltages of multiple transistors on the same wafer to different magnitudes such as polarization layer tuning have proven inadequate. The main disadvantage of polarization layer thickness tuning is process control. In particular, with regard to polarization layer thickness and etch rate which can be non-uniform across a wafer. As such, using the same etching methodology to etch the polarization layer at different places on the wafer can provide distinctly different results. For example, threshold voltage can change by as much as 0.5 volts for every 1 nm polarization layer thickness change. A process and device that addresses the shortcomings of such previous approaches is disclosed herein. As part of a disclosed process and device, an epitaxial region that includes a polarization layer superlattice, e.g., thin alternating layers of polarization and etch stop material is provided. Embodiments use etch techniques that select between the polarization and etch stop materials. In an embodiment, discrete numbers of superlattice pairs of polarization and etch stop material layers can be selectively removed. This enables control of threshold voltage through polarization layer thickness tuning using etch techniques.

An advantage of embodiments includes the capacity to utilize material differences to controllably remove specific amounts of a polarization layer in equal increments. This allows improved process control.

FIG. 1 is an illustration of a semiconductor structure 100 that includes first and second transistors that have different threshold voltages according to a previous approach. FIG. 1 shows epitaxial layer 101, source-drain regions 103, 105 and 107, etch stop layer 109, gate 111, high-k material 113, spacers 115, gate 117, high-k material 119, spacers 121 and polarization layer 123.

Referring to FIG. 1, the transistor 100A is shown on the right, and the transistor 100B is shown on the left. The transistor 100A includes the gate 111, and the transistor 100B includes the gate 117. The transistor 100A and the transistor 100B have different threshold voltages (Vt). The semiconductor structure 100 includes a thick polarization layer 123. The thick polarization layer 123 can be formed from indium aluminum nitride or aluminum gallium nitride. The thick polarization layer 123 can be thinned by various amounts, via dry etch, to form either an enhancement mode transistor (threshold voltage greater than zero) or a depletion mode transistor (threshold voltage less than zero). The amount of thinning that is done determines whether an enhancement mode transistor or a depletion mode transistor is formed. As shown in FIG. 1 the thick polarization layer 123 is thinned by a first amount to form an enhancement mode transistor (threshold voltage greater than zero) on the left and by a second amount to form a depletion mode transistor (threshold voltage less than zero) on the right. The process of thinning the polarization layer in order to achieve a target threshold voltage is termed polarization layer thickness "tuning". Polarization layer thickness tuning is typically done using dry etching processes. The main disadvantage of this approach relates to process control. In particular, the inability to control the etching of material as precisely as is required for some current technologies such as gallium nitride technologies. Threshold voltage can change by as much as 0.5 v for every 1 nm of polarization layer change. This becomes extremely challenging for manufacturing where very slight changes in threshold voltage can have severe impact on product performance.

FIG. 2 is an illustration of a semiconductor structure 200 that includes first and second transistors with different threshold voltages according to an embodiment. The threshold voltage of each of the transistors is set using a polarization layer superlattice to precisely provide a desired polarization layer thickness. FIG. 2 shows epitaxial layer 201, source-drain regions 203, 205 and 207, super lattice structure 209, gate 211, high-k material 213, spacers 215, insulator 216, gate 217, high-k material 219 and spacers 221.

Referring to FIG. 2, in the region of depletion mode transistor 200A, the epitaxial layer 201 is formed above a substrate (not shown). The superlattice structure 209 is formed above the epitaxial layer 201. The superlattice structure 209 is formed from layers of polarization layer material 209a and etch stop material 209b. The source 203 is formed in a space in the epitaxial layer 201 that extends below the top surface of the epitaxial layer 201. The gate 211 is formed in a trench that is formed by the spacers 215 and polarization material 209a on the side and etch stop material 209b on the bottom. The trench is lined with gate insulator 213. The drain 205 is formed in a space in the epitaxial layer 201 that extends below the top surface of the epitaxial layer 201.

In the region of the enhancement mode transistor 200B, the superlattice structure 209 is formed above the epitaxial layer 201. The source 207 is formed in a space in the epitaxial layer 201 that extends below the top surface of the epitaxial layer 201. The gate 217 is formed in a trench that is formed by the spacers 221, the polarization material 209a, and the etch stop material 209b, on the side and etch stop material 209b on the bottom. The trench is lined with gate insulator 219. The enhancement mode transistor 200B shares the drain 205 with the depletion mode transistor 200A.

Referring to FIG. 2, the superlattice structure 209 includes a plurality of layers of alternating material. In an embodiment, the alternating material includes etch stop material 209b and polarization material 209a. Thus, each layer of the superlattice structure 209 includes a discrete polarization layer. The thickness of the polarization layer that is located below a gate determines the threshold voltage of the transistor. In an embodiment, the thickness of the polarization layer below a gate of a transistor is the sum of the thicknesses of the polarization layers below the gate of the transistor. In an embodiment, each layer of the superlattice structure 209 corresponds to a threshold voltage. Thus, the threshold voltage can be "tuned" to a target threshold by identifying the superlattice layer to which a gate should extend to provide a polarization layer thickness below a gate that corresponds to the target threshold, and etching a gate trench that extends to that layer. This process is facilitated by the etch stop material associated with each layer. In particular, a trench of the appropriate depth can be ensured because etching the trench beyond the desired depth is prevented by the etch stop layer.

In an embodiment, the epitaxial layer 201 can be formed from gallium nitride. In other embodiments, the epitaxial layer 201 can be formed from other material. In an embodiment, the polarization material 209a can be formed from aluminum indium gallium nitride. In other embodiments, the polarization material 209a can be formed from other material. In an embodiment, the insulator 216 can be formed from silicon dioxide. In other embodiments, the insulator 216 can be formed from other material. In an embodiment, the source and the drain regions 203, 205 and 207 can be formed from indium gallium nitride. In other embodiments, the source and the drain regions 203, 205 and 207 can be formed from other materials. In an embodiment, the spacers 215 and 221 can be formed from silicon nitride. In other embodiments, the spacers 215 and 221 can be formed from other material. In an embodiment, the gate insulator 213 can be formed from a high-k material. In other embodiments, the gate insulator 213 can be formed from a low-k material. In an embodiment, the gate insulator 219 can be formed from a high-k material. In other embodiments, the gate insulator 219 can be formed from a low-k material. In an embodiments, the gate 211 can be formed from p-type work function metals such as titanium nitride, nickel, platinum and tungsten. In other embodiments, the gate 211 can be formed from other p-type work function metals. In an embodiment, the gate 217 is formed from an n-type work function metal. For example, in an embodiment, the gate 217 can be formed from materials that include aluminum, titanium, titanium aluminide, titanium aluminum nitride, tantalum and tantalum nitride. In other embodiments, the gate 217 can be formed from other n-type work function metal.

In operation, when a voltage that is applied to the gate 211 of the transistor 200A exceeds the threshold voltage of the transistor 200A, the transistor 200A is turned off. The threshold voltage of the transistor 200A is determined by the thickness of the polarization layer beneath the gate 211. The thickness of the polarization layer beneath the gate 211 depends upon the depth to which the gate 211 extends into the superlattice structure 209. The superlattice structure 209 defines discrete levels to which the gate 211 can extend. In an embodiment, the layers of the superlattice structure 209 are equally spaced and delineate discrete voltage thresholds. In FIG. 2, the gate 211 extends to the layer of the superlattice structure 209 that is furthest from the epitaxial layer 201. In this case, the thickness of the polarization layer underneath the gate 211 is significant. Because the thickness of the polarization layer is significant a depletion mode transistor (threshold voltage less than zero) is produced.

In operation, when a voltage that is applied to the gate 217 exceeds the threshold voltage of transistor 201B, current flows through the transistor channel from the source/drain region 205 to the source/drain region 207. The threshold voltage of the transistor determines when the transistor 200B turns on and off. The threshold voltage of the transistor 200B is determined by the thickness of the polarization layer beneath the gate 217. The thickness of the polarization layer beneath the gate 217 depends upon the depth to which the gate 217 extends into the superlattice structure 209. The superlattice structure 209 defines discrete levels to which the gate can extend. In an embodiment, the layers are equally spaced and delineate discrete voltage thresholds. In FIG. 2, the gate 217 extends to the layer of the superlattice structure 209 that is closest to epitaxial layer 201. In this case, the thickness of the polarization layer underneath the gate 217 is minimal (and less than the thickness of the polarization layer underneath the gate 211). Because the thickness of the polarization layer that is underneath the gate 217 is minimal an enhancement mode transistor (threshold voltage greater than zero) is produced.

FIGS. 1 and 2 illustrate the differences between the previous approach and the approach of embodiments to realizing target threshold voltages. In the approach of FIG. 1 a thick polarization layer such as indium aluminum nitride or aluminum gallium nitride is thinned by various degrees via dry etch, to create an enhancement mode transistor on the left and a depletion mode transistor on the right. As discussed above, in the approach of FIG. 1, the inability to control the etching of material as precisely as is required using etching alone presents significant challenges, as threshold voltage can change by as much as 0.5 v for every 1 nm change in the thickness of the polarization layer. In contrast, in the FIG. 2 embodiment, the polarization layer is formed by a superlattice of alternating layers of, for example, aluminum nitride and indium aluminum nitride. Based on the different etch characteristics of the alternating layers, an etch can be selectively stopped on any of the aluminum nitride layers. This provides discrete increments of threshold voltage control. Accordingly, in an embodiment, the superlattice enables a more precise realization of target polarization layer thicknesses.

FIGS. 3A-3C are illustrations of cross-sections of a semiconductor structure 300 under fabrication that includes a polarization layer superlattice according to an embodiment.

Referring to FIG. 3A, after a plurality of operations, the semiconductor structure 300 has the cross-section shown in FIG. 3A. As part of those operations, an epitaxial blanket gallium nitride film 301 is formed on a substrate (not shown). In an embodiment, the substrate is formed from silicon. In other embodiments, the substrate can be formed from other materials. In an embodiment, the epitaxial layer is terminated with a superlattice of alternating materials 303. In an embodiment, the superlattice of alternating materials 303 can include but is not limited to materials such as aluminum nitride and indium aluminum nitride. In FIG. 3A the superlattice of alternating materials 303 includes two superlattice layers are shown. However, the superlattice of alternating materials 303 can include any suitable number of layers. The aforementioned operations also include but are not limited to the formation of dummy polysilicon gates 305 and 307, sidewall spacers 309 and 310 and raised source and drain epitaxial regions 311, 313 and 315 (for improved contact resistance).

Referring to FIG. 3B, after one or more operations that result in the cross-section shown in FIG. 3A, in order to create an enhancement mode transistor on the left side of semiconductor structure 300, the right side of the semiconductor structure 300 is covered, and the dummy polysilicon gate 305 is removed from the left side of the semiconductor structure 300. In order to achieve a threshold voltage greater than zero indium aluminum nitride is etched landing on aluminum nitride (selectively), then aluminum nitride is etched, followed by another cycle of indium aluminum nitride etch landing on aluminum nitride. Finally, high-K, and metal gate material are deposited to fill the trench. In an embodiment a chemical mechanical polish (CMP) is performed after the trench is filled in order to planarize the surface of the semiconductor structure 300.

Referring to FIG. 3C, subsequent to one or more operations that result in the cross-section shown in FIG. 3B, the transistor 300B on the left of semiconductor structure 300 is covered, in order to facilitate the fabrication of the depletion mode transistor 300A on the right of the semiconductor structure 300. For example, the transistor on the left of the semiconductor structure 300 is covered, and polysilicon is removed from the trench on the right of the semiconductor structure 300. In order to keep the threshold voltage less than zero, an etch of the indium aluminum nitride polarization layer is performed that lands on the aluminum nitride etch stop material (selectively), then the high-K material, and the metal gate material are deposited to fill the trench. Thereafter, a chemical mechanical polishing (CMP) is performed to remove unwanted material. In other embodiments, unwanted material can be removed in other suitable manners of removing material from the semiconductor structure 300.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
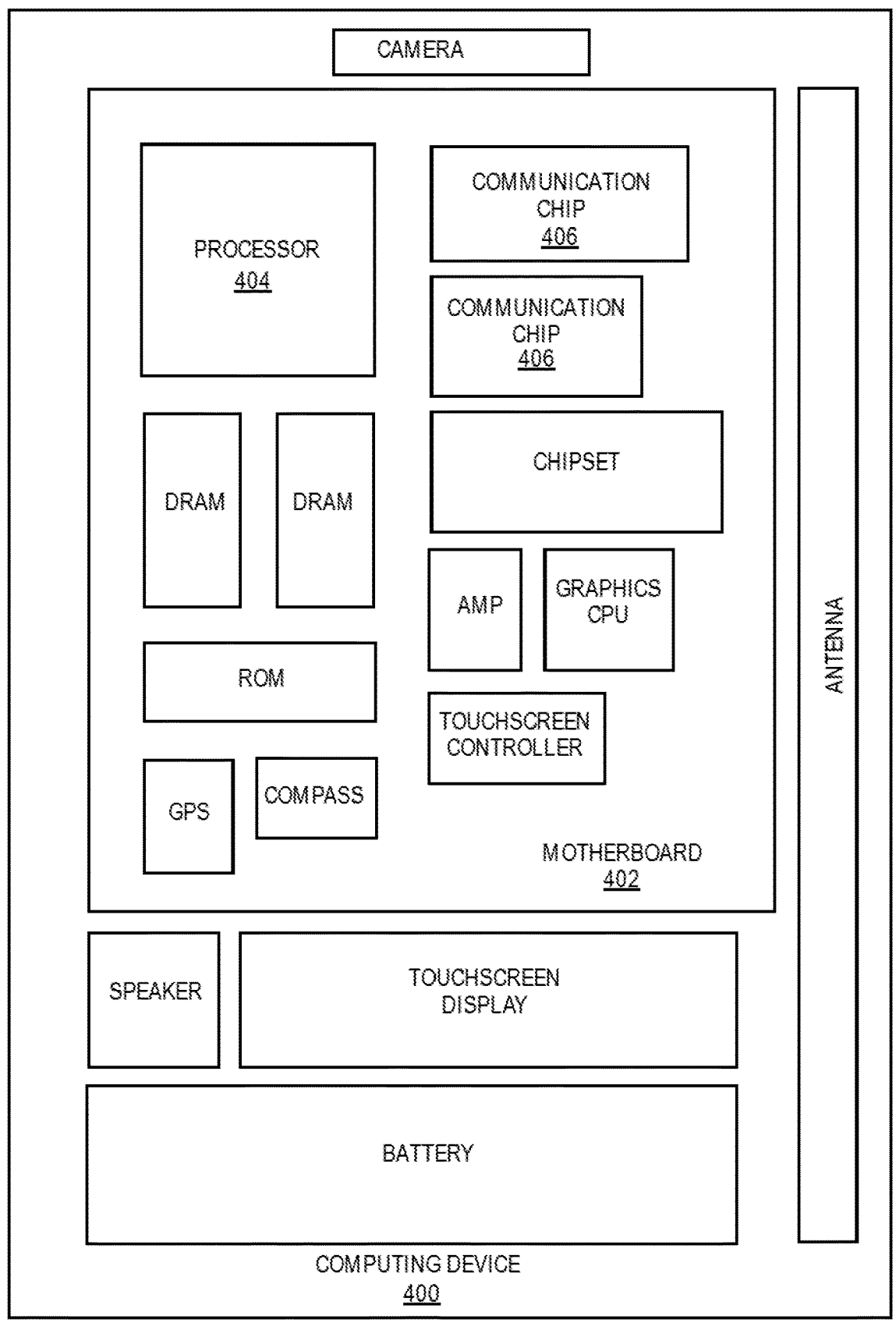
FIG. 4 illustrates a computing device in accordance with one implementation of an embodiment.

FIG. 4 illustrates a computing device 400 in accordance with one implementation of an embodiment. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
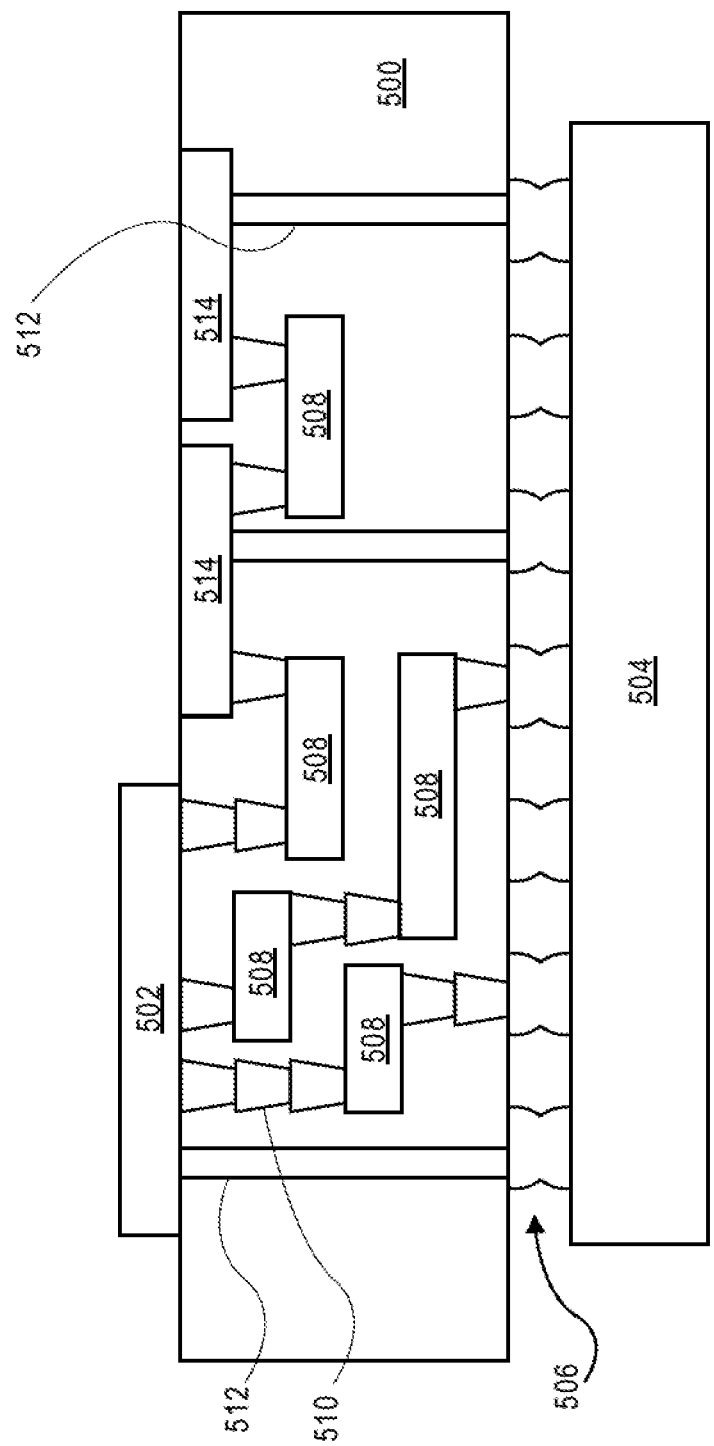
FIG. 5 illustrates an interposer that includes one or more embodiments.

FIG. 5 illustrates an interposer 500 that includes one or more embodiments. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A semiconductor device includes a substrate, a superlattice that includes a plurality of layers of alternating materials above the substrate, each of the plurality of layers corresponding to a threshold voltage, a gate trench extending into the superlattice to a predetermined one of the plurality of layers of the superlattice structure, and a high-k layer on the bottom and sidewalls of the trench, the high-k layer contacting an etch stop layer of one of the plurality of layers of alternating materials. The semiconductor device also includes a gate conductor in the trench on top of the high-k layer.

Example Embodiment 2

The semiconductor device of example embodiment 1, wherein each layer of the superlattice includes a polarization layer and an etch stop layer.

Example Embodiment 3

The semiconductor device of example embodiment 1, wherein the etch characteristics of each layer of the superlattice are different.

Example Embodiment 4

The semiconductor device of example embodiment 2, wherein the polarization layers of each layer of the superlattice is of equal thickness.

Example Embodiment 5

The semiconductor device of example embodiment 1, wherein source and drain regions extend through the superlattice.

Example Embodiment 6

The semiconductor device of example embodiment 1, wherein the source and the drain regions extend through the superlattice into an epitaxial layer that is above the substrate.

Example Embodiment 7

The semiconductor device of example embodiment 1, 2, 3, 4, 5 or 6, wherein spacers are above the superlattice on each side of the trench.

Example Embodiment 8

A semiconductor device includes a substrate, a superlattice that includes a plurality of layers of alternating materials above the substrate, each of the plurality of layers corresponding to a threshold voltage, a first gate trench extending into the superlattice to a first predetermined one of the plurality of layers of the superlattice structure, a second gate trench extending into the superlattice to a second predetermined one of the plurality of the layers of the superlattice structure, and a first high-k layer on the bottom and sidewalls of the first trench, the first high-k layer contacting an etch stop layer of a first one of the plurality of layers of alternating materials, a second high-k layer on the bottom and sidewalls of the second trench, the second high-k layer contacting an etch stop layer of a second one of the plurality of layers of alternating materials, and a first gate conductor in the first trench on top of the first high-k layer. The semiconductor device also includes a second gate conductor in the second trench on top of the second high-k layer.

Example Embodiment 9

The semiconductor device of example embodiment 8, wherein each layer of the superlattice includes a polarization layer and an etch stop layer.

Example Embodiment 10

The semiconductor device of example embodiment 8, wherein the etch characteristics of each layer of the superlattice are different.

Example Embodiment 11

The semiconductor device of example embodiment 9, wherein the polarization layers of each layer of the superlattice is of equal thickness.

Example Embodiment 12

The semiconductor example embodiment of claim 8, wherein the first gate corresponds to an enhancement mode transistor and the second gate corresponds to a depletion mode transistor.

Example Embodiment 13

The semiconductor example embodiment of claim 8, wherein the source and the drain regions extend through the superlattice into an epitaxial layer that is above the substrate.

Example Embodiment 14

The semiconductor example embodiment of claim 8, 9, 10, 11, 12 or 13, wherein spacers are above the superlattice on each side of the trench.

Example Embodiment 15

A method that includes forming a substrate, forming a superlattice that includes a plurality of layers of alternating materials above the substrate, each of the plurality of layers corresponding to a threshold voltage, forming a gate trench extending into the superlattice to a predetermined one of the plurality of the layers of the superlattice structure, and forming a high-k layer on the bottom and sidewall of the trench, the high-k layer contacting an etch stop layer of one of the plurality of layers of alternating materials. The semiconductor also includes forming a gate in the trench on top of the high-k layer.

Example Embodiment 16

The method of example embodiment 15, wherein each layer of the superlattice includes a polarization layer and an etch stop layer.

Example Embodiment 17

The method of example embodiment 15, wherein the etch characteristics of each layer of the superlattice are different.

Example Embodiment 18

The method of example embodiment 16, wherein the polarization layers of each layer of the superlattice is of equal thickness.

Example Embodiment 19

The method of example embodiment 15, wherein source and drain regions extend through the superlattice.

Example Embodiment 20

The method of example embodiment 15, 16, 17, 18 or 19 wherein the source and the drain regions extend through the superlattice into an epitaxial layer that is above the substrate.

What is claimed is:
1. A semiconductor device, comprising:
   a substrate;
   a superlattice that includes a plurality of layers of alternating materials above the substrate, each of the plurality of layers corresponding to a threshold voltage;
   a gate trench extending into the superlattice to a predetermined one of the plurality of layers of the superlattice;
   a first epitaxial semiconductor source or drain structure adjacent to a first side of the gate trench and extending through the superlattice;

a second epitaxial semiconductor source or drain structure adjacent to a second side of the gate trench and extending through the superlattice, the second side opposite the first side;

a high-k layer on the bottom and sidewall of the trench, the high-k layer contacting an etch stop layer of one of the plurality of layers of alternating materials; and a gate conductor in the trench on top of the high-k layer.

2. The semiconductor device of claim 1, wherein each layer of the superlattice includes a polarization layer and an etch stop layer.

3. The semiconductor device of claim 1, wherein the etch characteristics of each layer of the superlattice are different.

4. The semiconductor device of claim 2, wherein the polarization layers of each layer of the superlattice is of equal thickness.

5. The semiconductor device of claim 1, wherein the first and second epitaxial semiconductor source or drain structures extend entirely through the superlattice.

6. The semiconductor device of claim 1, wherein the first and second epitaxial semiconductor source or drain structures extend into an epitaxial layer that is above the substrate.

7. The semiconductor device of claim 1, wherein spacers are above the superlattice on each side of the trench.

8. A semiconductor device, comprising:
a substrate;
a superlattice that includes a plurality of layers of alternating materials above the substrate, each of the plurality of layers corresponding to a threshold voltage;
a first gate trench extending into the superlattice to a first predetermined one of the plurality of layers of the superlattice;
a first epitaxial semiconductor source or drain structure adjacent to a first side of the first gate trench and extending through the superlattice;
a second epitaxial semiconductor source or drain structure adjacent to a second side of the first gate trench and extending through the superlattice, the second side opposite the first side;
a second gate trench extending into the superlattice to a second predetermined one of the plurality of the layers of the superlattice;
a third epitaxial semiconductor source or drain structure adjacent to a first side of the second gate trench and extending through the superlattice;
a fourth epitaxial semiconductor source or drain structure adjacent to a second side of the second gate trench and extending through the superlattice, the second side opposite the first side;
a first high-k layer on the bottom and sidewall of the first trench, the first high-k layer contacting an etch stop layer of a first one of the plurality of layers of alternating materials;
a second high-k layer on the bottom and sidewall of the second trench, the second high-k layer contacting an etch stop layer of a second one of the plurality of layers of alternating materials;

a first gate in the first trench on top of the first high-k layer; and a second gate in the second trench on top of the second high-k layer.

9. The semiconductor device of claim 8, wherein each layer of the superlattice includes a polarization layer and an etch stop layer.

10. The semiconductor device of claim 8, wherein the etch characteristics of each layer of the superlattice are different.

11. The semiconductor device of claim 9, wherein the polarization layers of each layer of the superlattice is of equal thickness.

12. The semiconductor device of claim 8, wherein the first gate corresponds to an enhancement mode transistor and the second gate corresponds to a depletion mode transistor.

13. The semiconductor device of claim 8, wherein the first second, third and fourth epitaxial semiconductor source or drain structures extend through the superlattice into an epitaxial layer that is above the substrate.

14. The semiconductor device of claim 8, wherein spacers are above the superlattice on each side of the trench.

15. A method, comprising:
forming a substrate;
forming a superlattice that includes a plurality of layers of alternating materials above the substrate, each of the plurality of layers corresponding to a threshold voltage;
forming a gate trench extending into the superlattice to a predetermined one of the plurality of layers of the superlattice;
forming a first epitaxial semiconductor source or drain structure adjacent to a first side of the gate trench and extending through the superlattice;
forming a second epitaxial semiconductor source or drain structure adjacent to a second side of the gate trench and extending through the superlattice, the second side opposite the first side;
forming a high-k layer on the bottom and sidewall of the trench, the high-k layer contacting an etch stop layer of one of the plurality of layers of alternating materials; and
forming a gate in the trench on top of the high-k layer.

16. The method of claim 15, wherein each layer of the superlattice includes a polarization layer and an etch stop layer.

17. The method of claim 15, wherein the etch characteristics of each layer of the superlattice are different.

18. The method of claim 16, wherein the polarization layers of each layer of the superlattice is of equal thickness.

19. The method of claim 15, wherein the first and second epitaxial semiconductor source or drain structures extend entirely through the superlattice.

20. The method of claim 15, wherein the first and second epitaxial semiconductor source or drain regions structures extend into an epitaxial layer that is above the substrate.

* * * * *